(12) United States Patent
Doan et al.

(10) Patent No.: US 8,318,519 B2
(45) Date of Patent: *Nov. 27, 2012

(54) METHOD FOR HANDLING A SEMICONDUCTOR WAFER ASSEMBLY

(75) Inventors: Trung Tri Doan, Baoshan Township (TW); Chen-Fu Chu, Hsinchu (TW)

(73) Assignee: SemiLEDs Optoelectronics Co., Ltd., Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/758,475

(22) Filed: Jun. 5, 2007

(65) Prior Publication Data
US 2007/0231963 A1 Oct. 4, 2007

Related U.S. Application Data

(63) Continuation-in-part of application No. 11/032,882, filed on Jan. 11, 2005, now Pat. No. 7,432,119.

(51) Int. Cl.
*H01L 21/20* (2006.01)
(52) U.S. Cl. .... 438/33; 438/459; 438/113; 257/E33.066
(58) Field of Classification Search ............. 438/22–47, 438/106–113, 455–464, 977
See application file for complete search history.

(56) References Cited

U.S. PATENT DOCUMENTS

| | | | | |
|---|---|---|---|---|
| 6,555,405 | B2 * | 4/2003 | Chen et al. | 438/22 |
| 7,105,857 | B2 * | 9/2006 | Nagahama et al. | 257/86 |
| 7,195,944 | B2 * | 3/2007 | Tran et al. | 438/46 |
| 2002/0031908 | A1 * | 3/2002 | Tseng | 438/653 |
| 2003/0189215 | A1 * | 10/2003 | Lee et al. | 257/94 |
| 2004/0161010 | A1 * | 8/2004 | Matsumura | 372/46 |
| 2004/0203181 | A1 * | 10/2004 | Shang et al. | 438/30 |
| 2008/0149954 | A1 * | 6/2008 | Akita | 257/94 |

FOREIGN PATENT DOCUMENTS
WO    WO 2005/029573    *  3/2005

OTHER PUBLICATIONS

PCT International Search Report dated Sep. 29, 2008.

* cited by examiner

*Primary Examiner* — Savitr Mulpuri
(74) *Attorney, Agent, or Firm* — Patterson & Sheridan, L.L.P.

(57) ABSTRACT

Systems and methods for fabricating a light emitting diode include forming a multilayer epitaxial structure above a carrier substrate; depositing at least one metal layer above the multilayer epitaxial structure; removing the carrier substrate.

22 Claims, 4 Drawing Sheets

Laser beam

US 8,318,519 B2

METHOD FOR HANDLING A SEMICONDUCTOR WAFER ASSEMBLY

CROSS-REFERENCE TO RELATED APPLICATIONS

This application is a continuation-in-part of U.S. patent application Ser. No. 11/032,882, filed Jan. 11, 2005, now U.S. Pat. No. 7,432,119 which is herein incorporated by reference.

BACKGROUND OF THE INVENTION

1. Field of the Invention

The present invention generally relates to a light-emitting diode and a method for fabricating the same.

2. Description of the Related Art

Light-emitting diodes (LEDs) are playing an increasingly important role in our daily life. Traditionally, LEDs are become ubiquitous in many applications, such as communications and other areas, such as mobile phones, appliances and other electronic devices. Recently, the demand for nitride based semiconductor materials (e.g., having Gallium Nitride or GaN) for opto-electronics has increased dramatically for applications such as video displays, optical storage, lighting, medical instruments, for-example. Conventional blue light-emitting diodes (LEDs) are formed using semiconductor materials of nitride, such as GaN, Al GaN, InGaN and AlInGaN. Most of the semiconductor layers of the aforementioned-typed light emitting devices are epitaxially formed on electrically non-conductive sapphire substrates. Since the sapphire substrate is an electrically insulator, electrodes cannot be directly formed on the sapphire substrate to drive currents through the LEDs. Rather, the electrodes directly contact a p-typed semiconductor layer and an n-typed semiconductor layer individually, so as to complete the fabrication of the LED devices. However such configuration of electrodes and electrically non-conductive nature of sapphire substrate represents a significant limitation for the device operation. For example, a semi-transparent contact needs to be formed on the p-layer to spread out the current from p-electrode to n-electrode. This semi-transparent contact reduces the light intensity emitted from the device due to internal reflectance and absorption. Moreover, p- and n-electrodes obstruct the light and reduce the area of light emitting from the device. Additionally, the sapphire substrate is a heat insulator (or a thermal insulator) and the heat generated during the device operation can not be effectively dissipated, thus limiting the device reliability.

FIG. 1 shows one such conventional LED. As shown therein, the substrate is denoted as 1. The substrate 1 can be mostly sapphire. Over the substrate 1, a buffer layer 2 is formed to reduce the lattice mismatch between substrate 1 and GaN. The buffer layer 2 can be epitaxially grown on the substrate 1 and can be AlN, GaN, AlGaN or AlInGaN. Next, an n-GaN based layer 3, a multi-quantum well (MQW) layer 4, and a p-GaN layer 5 are formed in sequence. An etching method is employed to form an exposing region 6 on the n-GaN based layer 3. An electrical conductive semi-transparent coating is provided above the p-GaN layer 5. Finally, the n-electrode 9 and p-electrode 8 are formed on selected electrode areas. The n-electrode 9 is needed on the same side of device as p-electrode to inject electrons and holes into the MQW active layer 4, respectively. The radiative recombination of holes and electrons in the layer 4 emits light. However, limitations of this conventional LED structure include: (1) Semi-transparent contact on p-layer 5 is not 100% transparent and can block the light emitted from layer 4; (2) current spreading from n-electrode to p-electrode is not uniform due to position of electrodes; and (3) heat is accumulated during device operation since sapphire is a thermal and electrical insulator.

To increase available lighting area, vertical LEDs have been developed. As shown in FIG. 2, a typical vertical LED has a substrate 10 (typically silicon, GaAs or Ge). Over the substrate 10, a transition metal multi-layer 12, a p-GaN layer 14, an MQW layer 16, a n-GaN layer 18 are then formed. The n-electrode 20 and the p-electrode 22 are then formed on selected areas as electrodes.

U.S. patent publication No. 2004/0135158 shows one way to realize vertical LED structure by (a) forming a buffering layer over a sapphire substrate; (b) forming a plurality of masks over said buffering layer, wherein said substrate, said buffering layer and said plurality of masks jointly form a substrate unit; (c) forming a multi-layer epitaxial structure over said plurality of masks, wherein said multi-layer epitaxial structure comprises an active layer; extracting said multi-layer epitaxial structure; (d) removing said remaining masks bonding with a bottom side of said multi-layer epitaxial structure after extracting; (e) coating a metal reflector over said bottom side of said multi-layer epitaxial structure; (f) bonding a conductive substrate to said metal reflector; and (g) disposing a p-electrode over an upper surface of said multi-layer structure and an n-electrode over a bottom side of said conductive substrate.

SUMMARY OF THE INVENTION

In one aspect, a method for fabricating a light emitting diode includes forming a multilayer epitaxial structure above a carrier substrate; depositing at least one metal layer above the multilayer epitaxial structure; removing the carrier substrate.

Implementations of the above aspect may include one or more of the following. The carrier substrate can be sapphire. The deposition of the metal layer does not involve bonding or gluing the metal layer to a structure on the substrate. The depositing of the metal layer can apply using electro chemical deposition, electroless chemical deposition, CVD chemical vapor deposition, MOCVD Metal Organic CVD, PECVD Plasma enhanced CVD, ALD Atomic layer deposition, PVD Physical vapor deposition, evaporation, or plasma spray, or the combination of these techniques. The metal layer can be single or multi-layered. A multi-layered metal layer may provide for control over the stress experienced by the underlying compound semiconductor layers (e.g., GaN) of the multilayer epitaxial structure. For example, the initial metal layer(s) deposited above the multilayer epitaxial structure may comprise relatively soft metals or alloys in an effort to absorb the stress of additional semiconductor processing and avoid cracking. Additional metal layer(s) deposited above the initial metal layer(s) may comprise relatively hard metals or alloys and may compensate for the thermal expansion of the initial metal layer(s). In such a multi-layered metal structure, the thickness and the composition of the individual layers may be varied to achieve different stress reduction, thermal compensation, heat dissipation and handling properties. In case that the metal layer is a multi-layer, the layers could be deposited using different techniques. In one embodiment, the thickest layer is deposited using electro or electroless chemical deposition In another aspect, a method for fabricating a light emitting diode includes providing a carrier substrate; depositing a multilayer epitaxial structure; depositing one or more metal layers above the multilayer epitaxial structure; defining one or more mesas using etching; forming one or more nonconductive layers; removing a portion of the non conductive layers; depositing at least one or more metal layers; removing the carrier substrate.

Implementations of the above aspect can include one or more of the following. The metal layers could have same or different composition and deposited using various deposition techniques. The carrier substrate removal can be done using laser, etching, grinding/lapping or chemical mechanical polishing or wet etching, among others. The carrier substrate can be sapphire, silicon carbide, silicon, germanium, ZnO or gallium arsenide. The multi layer epitaxial structure can be an n-type GaN layer, one or more quantum wells with InGaN/GaN layers, and a p-type AlGaN/GaN layer. The one or more metal layers above the multi layer epitaxial structure can be Indium Tin Oxide (ITO), Ag, Al, Cr, Ni, Au, Pt, Pd, Ti, Ta, TiN, TaN, Mo, W, a refractory metal, or a metal alloy, or a composite of these materials. An optional doped semiconductor layer can be formed between the multi layer epitaxial structure and the metal layers. The mesa can be defined using a polymer (for example: resist) or a hard mask (for example: $SiO_2$, $Si_3N_4$, Aluminum). The non-conductive layer can be $SiO_2$, $Si_3N_4$, a diamond element, a non-conducting metal oxide element or a ceramic element or a composite of these materials; The non-conductive layer could be a single layer or could have a plurality of non-conductive layers (for example: $SiO_2$ on $Si_3N_4$). In one implementation, the non-conductive layer is the sidewall passivation layer or passivation layer. A portion of the non conductive layer can be removed by lifting off or dry etching to expose a conductor layer with or without using a masking layer. The conductor layer can be one or more metal layers. The one or more metal layers can be deposited using physical vapor deposition (PVD), chemical vapor deposition (CVD), plasma enhanced CVD (PECVD), evaporation, ion beam deposition, electro chemical deposition, electroless chemical deposition, plasma spray, or ink jet deposition. The metal layer can include chromium (Cr), platinum (Pt), nickel (Ni), Copper, Copper on a barrier metal material (for examples: Titanium Nitride, Tungsten, Tungsten nitride, tantalum nitride, molybdenum (Mo), tungsten (W) or a metal alloy. One or more of the additional metal layers can be formed by electro chemical plating or electroless chemical plating. The additional metal layer can be copper (Cu), nickel (Ni), gold (Au), aluminum (Al), or an alloy thereof. A conductive passivation (protecting the metal layer) layer can be deposited, and can be a metal, nickel (Ni), chromium (Cr), or zinc (Zn), Gold, Pt, Pd. The passivation layer comprises one of: non conductive metal oxide (Hafnium oxide, Titanium oxide, Tantalum oxide), Silicon dioxide, Silicon Nitride or a polymer material.

In one embodiment, Ag/Pt or Ag/Pd or Ag/Cr is used as a mirror layer. Ni is used as a barrier for Gold as a seed layer for electroplating. The mirror layer (Ag, Al, Pt, Ti, Cr for example) is deposited and then a barrier layer such as TiN, TaN, TiWN, TiW stuffed with Oxygen is formed above the mirror layer before electro or electroless chemical deposition of a metal such as Ni, Cu, W. For electrochemical deposition of copper, a seed layer is deposited using CVD, MOCVD, PVD, ALD, or evaporation process; some of the seed materials for Copper are W, Au, Cu or Ni, among others.

In another method for fabricating a light emitting diode, the process includes providing carrier substrate; depositing a multilayer epitaxial structure; depositing one or more metal layers above the multilayer epitaxial structure; etching one or more mesas; forming one or more non conductive layers; removing a portion of the non conductive layers; depositing one or more metal layers; removing the carrier substrate.

Implementations of the above method may include one or more of the following. The metal layers could have same or different composition, different thicknesses, and be deposited using various deposition techniques. The carrier substrate removal can be done using laser, etching, grinding/lapping or chemical mechanical polishing or wet etching, among others. The carrier substrate can be sapphire. The depositing the metal layer can be electro chemical deposition (ECD) or electroless chemical deposition (ElessCD); before depositing the metal layer using electro chemical or electroless chemical deposition techniques, an optional step for a seed conductive layer is employed (for example Copper, Nickel, tungsten seed layers deposited first using evaporation, sputtering or CVD, MOCVD before ECD of Copper, Nickel). The depositing the metal layer can include CVD, PECVD, PVD, evaporation, or plasma spray. Electrodes can be placed on the multilayer structure. One or more additional metal layers can be formed above the original metal layer.

In another method for fabricating a light emitting diode, the process includes providing carrier substrate; depositing a multilayer epitaxial structure; etching one or more mesas; forming one or more non conductive layers; removing a portion of the non conductive layers; depositing one or more metal layers; removing the carrier substrate.

Implementations of the above method may include one or more of the following. The metal layers could have same or different composition and deposited using various deposition techniques. The carrier substrate removal can be done using laser, etching, grinding/lapping or chemical mechanical polishing or wet etching, among others. The carrier substrate can be sapphire. The depositing the metal layer can be electro chemical deposition (ECD) or electroless chemical deposition (ElessCD); before depositing the metal layer using electro chemical or electroless chemical deposition techniques, an optional step for a seed conductive layer is employed (for example Copper, Nickel, tungsten seed layers deposited first using evaporation, sputtering or CVD, MOCVD before ECD of Copper, Nickel). The depositing the metal layer can include CVD, PECVD, PVD, evaporation, or plasma spray. Electrodes can be placed on the multilayer structure. One or more additional metal layers can be formed above the original metal layer to protect the underlying metal.

In a further aspect, a method for fabricating a light emitting diode includes forming a multi layer epitaxial structure above a substrate (such as a sapphire substrate, for example), depositing a metal layer above the epitaxial layer (using electro or electroless chemical plating on top of a seed metal layer; Copper or nickel plating on top of a seed layer of copper or nickel or Tungsten or Pd deposited using evaporation, CVD, PVD sputtering. The seed layer is deposited on a barrier metal of TaN, TiN, TiWN, TiWOx or Tungsten Nitride), and removing the substrate (using laser lift-off technique, wet etching or CMP, for examples).

In one implementation, the multi-layer epitaxial structure includes a reflective metal layer coupled to the metal plating layer; a non-conductive passivation layer coupled to the reflective metal layer; a p-GaN layer coupled to the passivation layer; a multi-quantum well (MQW) layer coupled to the p-GaN layer; a n-GaN layer coupled to the MQW layer; an n-electrode coupled to the n-GaN layer.

The metal layer can be single or multi-layered. In case that the metal layer is a multi-layer, a plurality of metal layers with different composition can be formed and the layers could be deposited using different techniques. In one embodiment, the thickest layer is deposited using electro or electroless chemical deposition In one embodiment, Ag/Pt or Ag/Pd or Ag/Cr is used as a mirror layer, and Ni is used as a barrier for Gold as a seed layer for copper plating, which is used as the bulk substrate. The mirror layer (Ag, Al, Ti, Cr, Pt for example) is deposited and then a barrier layer such as TiN, TaN, TiWN, TiW stuffed with Oxygen is formed above the mirror layer before electro or electroless chemical deposition of a metal such as Ni or Cu. For electrochemical deposition of copper, a seed layer is deposited using CVD, MOCVD, PVD, ALD, or evaporation process with Au, Cu or Ni, among others.

In yet another aspect, a method for fabricating a light emitting diode, includes forming a multi-layer epitaxial structure over a sapphire substrate, wherein the multi-layer epitaxial structure comprises a multi-quantum well (MQW) layer; coating a metal plating layer above the multi-layer epitaxial structure; removing the sapphire substrate; and providing an n-electrode on the surface of the multi-layer structure. The p-electrode is coupled to the metal plating layer, or the metal plating layer itself acts as the p-electrode.

Implementations of the above aspect may include one or more of the following. The metal plating layer can be formed by electro or electroless chemical plating. The metal plating layer can also be formed using electroless chemical plating and by protecting the sapphire substrate with a polyimide layer. The sapphire substrate can be removed using laser lift-off (LLO) technique. The multilayer epitaxial layer can have a reflective metal layer coupled to the metal plating layer; a passivation layer coupled to the reflective metal layer; a p-GaN layer coupled to the passivation layer; a n-GaN layer coupled to the MQW layer; an n-electrode coupled to the n-GaN layer; and the metal plating layer is a p-electrode or having a p-electrode coupled to the metal plating layer. In another aspect, a vertical device structure for a light-emitting diode (LED) device can be fabricated by forming a multi-layer epitaxial structure over a sapphire substrate, wherein the multi-layer epitaxial structure comprises an multi-quantum well (MQW) active layer; coating a metal layer above the multi-layer epitaxial structure; removing the sapphire substrate; and providing an n-electrode on the surface of the multi-layer structure and the metal layer is a p-electrode or having a p-electrode coupled to the metal layer.

The metal layer can be single or multi-layered. In case that the metal layer is a multi-layer, a plurality of metal layers with different composition can be formed and the layers could be deposited using different techniques. In embodiment, the thickest layer is deposited using electro or electroless chemical deposition In one embodiment, Ag/Pt or Ag/Pd or Ag/Cr is used as a mirror layer, and Ni is used as a barrier for Gold as a seed layer for copper plating, which is used as the bulk substrate. The mirror layer (Ag, Al, Ti, Cr, Pt for example) is deposited and then a barrier layer such as TiN, TaN, TiWN, TiW stuffed with Oxygen is formed above the mirror layer before electro or electroless chemical deposition of a metal such as Ni or Cu. For electrochemical deposition of copper, a seed layer is deposited using CVD, MOCVD, PVD, ALD, or evaporation process with Au, Cu or Ni, among others.

In yet another aspect, a vertical LED includes a multilayer epitaxial layer formed above a temporary substrate; a metal plating layer formed above the multilayer epitaxial layer, before depositing the metal layer using electro chemical or electroless chemical deposition techniques, an optional step for a seed conductive layer is employed (for example Copper, Nickel, tungsten seed layers deposited first using evaporation, sputtering or CVD, MOCVD before ECD of Copper, Nickel), wherein the temporary substrate is removed using laser-lift-off after forming the metal plating layer.

In one embodiment, Ag/Pt or Ag/Pd or Ag/Cr is used as a mirror layer, and Ni is used as a barrier for Gold as a seed layer for copper plating, which is used as the bulk substrate. The mirror layer (Ag, Al, Ti, Cr, Pt for example) is deposited and then a barrier layer such as TiN, TaN, TiWN, TiW stuffed with Oxygen is formed above the mirror layer before electro or electroless chemical deposition of a metal such as Ni or Cu. For electrochemical deposition of copper, a seed layer is deposited using CVD, MOCVD, PVD, ALD, or evaporation process with Au, Cu or Ni, among others.

In another aspect, a vertical light emitting diode includes a metal plating layer; a reflective metal layer coupled to the metal plating layer; a passivation layer coupled to the reflective metal layer; a p-GaN layer coupled to the passivation layer; a multi-quantum well (MQW) layer coupled to the p-GaN layer; a n-GaN layer coupled to the MQW layer; an n-electrode coupled to the n-GaN layer; and a p-electrode coupled to the metal plating layer.

In one embodiment, Ag/Pt or Ag/Pd or Ag/Cr is used as a mirror layer, and Ni is used as a barrier for Gold as a seed layer for copper plating, which is used as the bulk substrate. The mirror layer (Ag, Al, Ti, Cr, Pt for example) is deposited and then a barrier layer such as TiN, TaN, TiWN, TiW stuffed with Oxygen is formed above the mirror layer before electro or electroless chemical deposition of a metal such as Ni or Cu. For electrochemical deposition of copper, a seed layer is deposited using CVD, MOCVD, PVD, ALD, or evaporation process with Au, Cu or Ni, among others.

Advantage of the invention may include one or more of the following. No wafer bonding or gluing is used and the complex and lengthy and one at a time wafer bonding/gluing process is replaced by a less complex deposition process for example physical vapor deposition (PVD), chemical vapor deposition (CVD), plasma enhanced CVD (PECVD), evaporation, ion beam deposition, electro chemical deposition, electroless chemical deposition, plasma spray, or ink jet deposition. No semi-transparent contact is needed for the n-electrode since n-GaN conductivity is good, and as a result, more light output can be emitted from the LED device. Further, since only one electrode is needed on each side of the device, the LED electrode obstructs less light. Additionally, current can spread out uniformly from n-electrode to p-electrode, thus increasing LED performance. Moreover, the metal substrate can dissipate more heat than the sapphire substrate, so more current can be used to drive the LED. The resulting LED can replace the conventional LED at a smaller size. For the same LED size, the light output from vertical LED is significantly higher than the conventional LED for the same drive current. Moreover, the multi-layered metal substrate may be engineered by designing the thickness and composition of the individual metal layers to prevent cracking of the GaN device structure and achieve a desired hardness and thermal expansion coefficient.

Yet another embodiment of the present invention is a method. The method generally includes the steps of providing a wafer assembly comprising one or more semiconductor dies disposed on a carrier substrate; forming one or more metal layers above the one or more semiconductor dies to create at least a portion of a metal substrate; removing the carrier substrate from the wafer assembly; and manipulating the wafer assembly via the metal substrate for further processing. The thickness and composition of the layers of a multi-layered metal substrate may be designed to minimize cracking of the semiconductor dies at elevated temperatures during subsequent operations.

Yet another embodiment of the present invention is a method. The method generally includes the steps of providing a wafer assembly comprising one or more vertical light-emitting diode (VLED) dies disposed on a carrier substrate; forming one or more metal layers above the one or more VLED dies to create at least a portion of a metal substrate; removing the carrier substrate from the wafer assembly; and handling the wafer assembly via the metal substrate for further semiconductor processing. The thickness and composition of the layers of a multi-layered metal substrate may be designed to minimize cracking of the VLED dies at elevated temperatures during subsequent operations.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To better understand the other features, technical concepts and objects of the present invention, one may clearly read the description of the following preferred embodiments and the accompanying drawings, in which.

DETAILED DESCRIPTION

Figure 1:
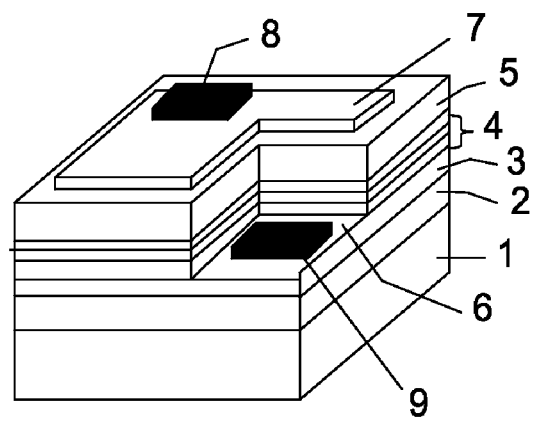
FIG. 1 shows a prior art conventional LED.
Figure 2:
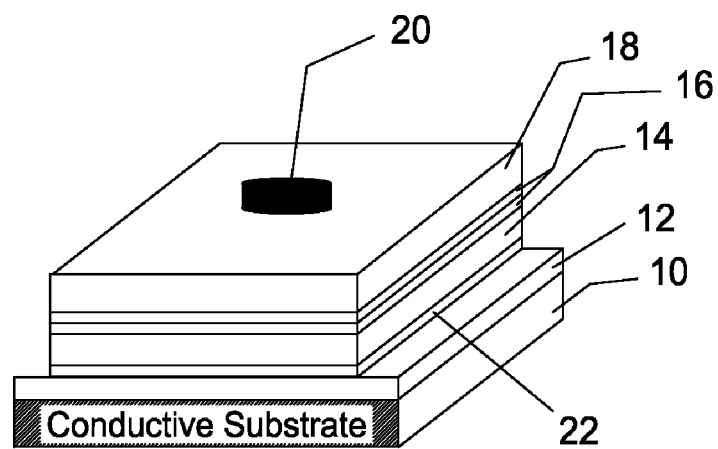
FIG. 2 shows a prior art vertical LED.

In reading the detailed description, the accompanying drawings may be referenced at the same time and considered as part of the detailed description.

Referring to FIGS. 3 to 8, a manufacturing method for vertical LEDs is illustrated therein. In the description, the reference numerals given for the inventive device structure will be also used in the recitation of the steps of the inventive manufacturing method.

The process described below is for one embodiment with InGaN LEDs initially grown on sapphire. Electro or Electroless Chemical plating is then used to deposit a thick contact for electrical and thermal conduction for the resulting LED device. Electro or Electroless Chemical plating is used in lieu of wafer bonding. The process can be applied to any optoelectronic device where bonding was used to attach the epilayer to a new host substrate for improvement of optical, electrical and thermal properties.

For example, the techniques described herein may be applied to power devices, laser diodes, and vertical cavity surface emitting devices in addition to LEDs.

Figure 3:
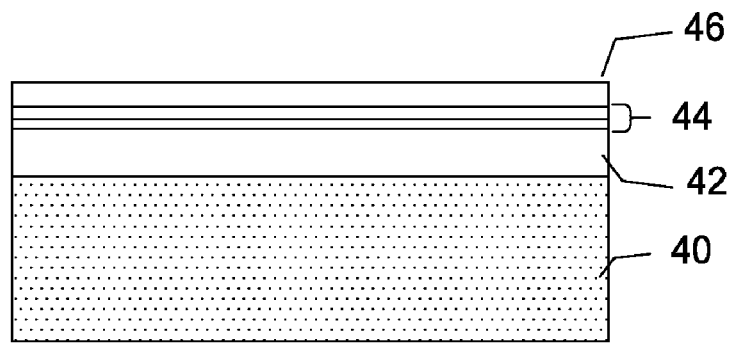
FIGS. 3-8 show operations in an exemplary process to fabricate a vertical LED.

Turning now to the diagrams, FIG. 3 shows a multi-layer epitaxial structure of an exemplary InGaN LED on a carrier 40, which can be a sapphire substrate in one embodiment. The multi-layer epitaxial structure formed above the sapphire substrate 40 includes an n-GaN based layer 42, an MQW active layer 44 and a contact layer 46. The n-GaN based layer 42 having a thickness of about 4 microns, for example.

The MQW active layer 44 can be an InGaN/GaN (or AlGaN/GaN or AlInGaN) MQW active layer. Once an electrical current is passed between the n-GaN based layer 42 and the contact layer 46, the MQW active layer 44 may be excited and thus generates a light. The produced light can have a wavelength between 250 nm to 600 nm. The p-layer can be a p$^+$-GaN based layer, such as a p$^+$-GaN, a p$^+$-InGaN or a p$^+$-AlInGaN layer and the thickness thereof may be between 0.01-0.5 microns.

Figure 4:
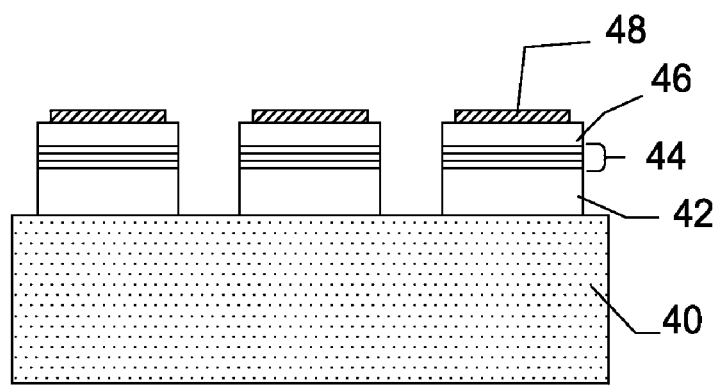

Next, as shown in FIG. 4, a mesa definition process is performed and p-type contacts 48 are formed above the contact layer 46. The contacts 48 above the multi layer epitaxial structure can be Indium Tin Oxide (ITO), Ag, Al, Cr, Ni, Au, Pt, Pd, Ti, Ta, TiN, TaN, Mo, W, a refractory metal, or a metal alloy, or a composite of these materials (for example Ni/Au), among others. In addition, direct reflected Ag deposition as a metal contact could be also formed. In FIG. 4, individual LED devices are formed following mesa definition. Ion coupled plasma etching is used to etch GaN into separate devices.

Figure 5:
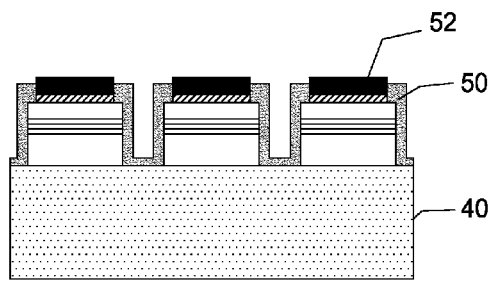

Next, as shown in FIG. 5, a passivation layer 50 is deposited and reflective metal deposition is performed to form a reflective metal 52 such as Al, Ag, Ni, Pt and Cr, among others, in a window etched into the passivation layer 50 to allow the reflective metal 52 to contact layer 46. The passivation layer 50 is non-conductive. The reflective metal 52 forms a mirror surface.

Figure 6:
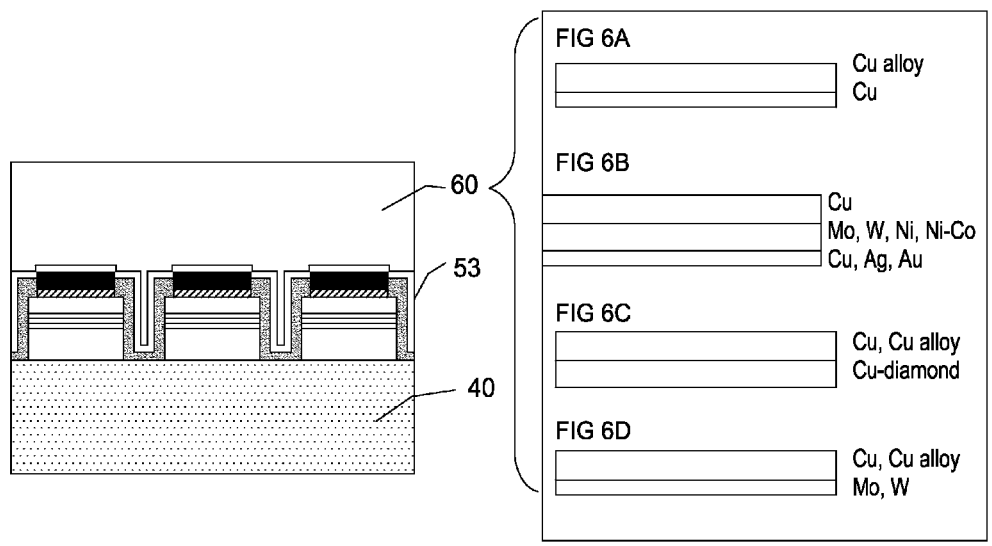

FIG. 6 shows that a thin metal layer or a multi-metal layer 53 (Cr, Pt, Pt/Au, Cr/Au, Ni/Au, Ti/Au, TaN/Au among others) is deposited over the structure to serve as a barrier/seed layer for the electro/electroless chemical plating process. However the depositing operation is not needed if an electroless process, sputtering or magneto-sputtering process is used in lieu of electroplating. Suitable metals or metal alloys for the barrier/seed layer may be Cu, Ni, W, Ta/Cu, Ta/TaN/Cu, TaN/Cu, Ti/TaN/Cu, Ta/TiN/Cu, Ti/Cu, Ti/TiN/Cu, TiN/Cu, Cr/Au, Cr/Au/Ni/Au, or Ti/Ni/Au.

A metal substrate layer 60 is deposited thereon. The metal substrate 60 may consist of multiple metal layers allowing one to engineer the thickness and composition of the layers of the multi-layered metal substrate to minimize cracking of the compound semiconductor structure at elevated temperatures during subsequent operations. The thin metal layer or film 53 is provided as a seeding material purpose of the metal plating layer 60. The thin metal film 53 may be the same or different material with the metal plating layer 60 as long as the metal plating layer 60 may be plated on top of the film 53 using electrochemical deposition or electroless chemical deposition.

FIG. 6A illustrates a relatively soft stress-reducing/shock-absorbing metal layer comprising Cu deposited as an initial layer of the metal substrate 60 with a harder and thermal expansion compensated Cu alloy layer (e.g., Cu—W or Cu—Mo) deposited above in an effort to minimize the GaN cracking. FIG. 6B depicts a relatively soft stress-reducing/shock-absorbing metal layer comprising Cu deposited as an initial layer with one or more harder metal layers (e.g., Mo, W, Ni, or Ni—Co) subsequently deposited above in an effort to obtain a desired hardness followed by an additional Cu layer. The final Cu layer shown may be deposited on the intermediate harder layer(s) to compensate for the stress resulting from deposition of the intermediate harder layer(s). FIG. 6C portrays an initial deposited layer of diamond-mixed Cu combining the properties of stress relief and hardness and an additional thick layer of Cu or a Cu alloy deposited above the initial layer in an effort to compensate for thermal expansion and/or stress. FIG. 6D illustrates an initial metal layer comprising any suitable metal or metal alloy to match the thermal expansion coefficient of the underlying compound semiconductor (e.g., GaN) layers, such as W or Mo in an effort to minimize semiconductor cracking. For comparison, the GaN thermal expansion coefficient is 3.17E-6 K$^{-1}$, Cu is 16.5E-6 K$^{-1}$, Ni is 13.4E-6 K$^{-1}$, Co is 13E-6 K$^{-1}$, Mo is 4.2E-6 K$^{-1}$, and W is 4.5E-6 K$^{-1}$. A high thermal conductivity metal (e.g., Cu or Ag) may be deposited above the initial metal layer for thermal dissipation as shown.

For some embodiments, the reflective layer 52 may function as the barrier/seed metal layer without the need for a separate metal layer 53. In such cases, the reflective layer 52 may comprise any suitable metal or metal alloy, such as Ag/Ti/Au, Ag/TiN/Cu, Ag/Ta/Au, Ag/W/Au, Ag/TaN/Cu, Al/Ta/Au, or Al/TaN/Cu, possessing optically reflective and electrically conductive properties.

As an option for some embodiments, the surface of the epitaxially-formed devices may be plasma treated before the metal substrate 60 is deposited. By roughening the surface of the semiconductor materials, plasma treatment may improve adhesion of the metal substrate 60 or the seed layer to the underlying semiconductor layers.

Figure 7:
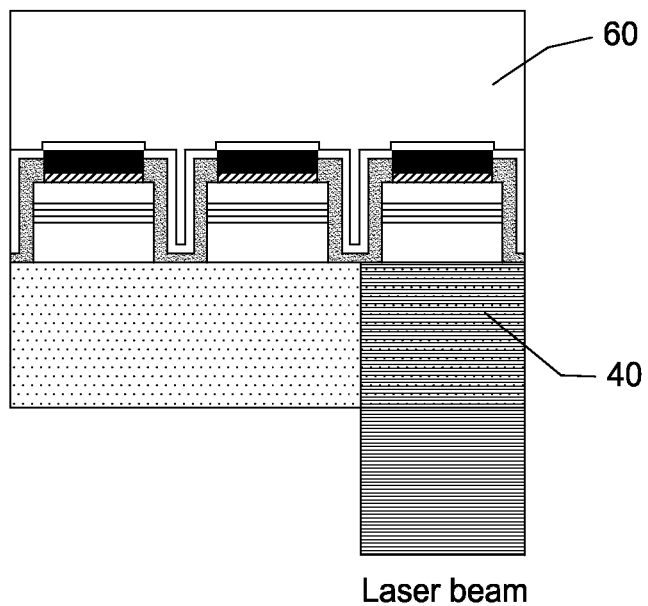

Turning now to FIG. 7, the multi-layer epitaxial structure is coated with a metal plating layer 60 using techniques such as electro and electroless chemical plating. The metal plating layer 60 may comprise multiple metal layers allowing one to engineer the thickness and composition of the layers of the multi-layered metal substrate to minimize cracking of the GaN structure at elevated temperatures during subsequent operations. With electroless chemical plating, the sapphire substrate 40 is protected using a polyimide layer or a coating that can be easily removed without damaging the sapphire or the electroless plated metal of a relatively thick metal such as Ni or Cu, among others.

The thickness of the metal substrate may range from 10 to 400 μm. For some embodiments, the metal substrate 60 may comprise cobalt (Co) or an alloy thereof in one or more layers. Being harder than many metals including iron, the use of cobalt in the metal substrate 60 may allow for secure handling and manipulation of the very thin wafer assembly during further processing after the sapphire substrate 40 has been removed. Other suitably hard metals may also be used, such as tungsten (W), chrome (Cr), nickel (Ni), molybdenum (Mo), or their alloys.

For some embodiments, one or more additional metal layers (not shown) may be deposited above the metal substrate 60 to protect the underlying material from oxidation. These oxidation protection layers may comprise any suitable metal or metal alloy, such as Cr/Au, Ni, or Ni/Au.

Next, the sapphire substrate 40 is removed. In one embodiment shown in FIG. 8, a laser lift-off (LLO) operation is applied to the sapphire substrate 40. Sapphire substrate removal using laser lift-off is known, reference U.S. Pat. No. 6,071,795 to Cheung et al., entitled, "Separation of Thin Films From Transparent Substrates By Selective Optical Processing," issued on Jun. 6, 2000, and Kelly et al. "Optical process for liftoff of group III-nitride films", Physica Status Solidi (a) vol. 159, 1997, pp. R3-R4). Furthermore, highly advantageous methods of fabricating GaN semiconductor layers on sapphire (or other insulating and/or hard) substrates are taught in U.S. patent application Ser. No. 10/118,317 entitled "A Method of Fabricating Vertical Devices Using a Metal Support Film" and filed on Apr. 9, 2002 by Myung Cheol Yoo, and in U.S. patent application Ser. No. 10/118,316 entitled "Method of Fabricating Vertical Structure" and filed on Apr. 9, 2002 by Lee et al. Additionally, a method of etching GaN and sapphire (and other materials) is taught in U.S. patent application Ser. No. 10/118,318 entitled "A Method to Improve Light Output of GaN-Based Light Emitting Diodes" and filed on Apr. 9, 2002 by Yeom et al., all of which are hereby incorporated by reference as if fully set forth herein. In other embodiments, the sapphire substrate is removed by wet or dry etching, or chemical mechanical polishing.

Laser lift-off of the carrier substrate (e.g., sapphire substrate 40) may be accomplished by pulse laser irradiation. For other embodiments, the carrier substrate may be removed from the wafer assembly by selected photo-enhanced chemical etching.

Figure 8:
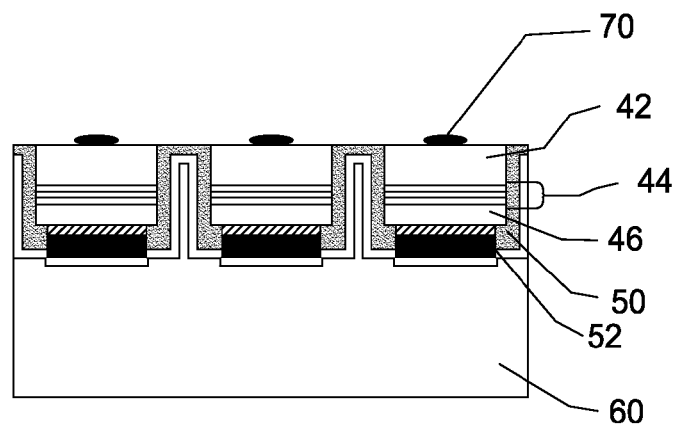

As shown in FIG. 8, an n-type electrode/bond pad 70 is patterned on the top of n-GaN layer 42 to complete the vertical LED. In one embodiment, bond pad 70 such as Ni/Cr (Ni is in contact with n-GaN) can be deposited using CVD, PVP or ebeam evaporation. The bond pad 70 is formed by wet or dry etch with a masking layer or using lift-off techniques with a negative masking layer (negative masking layer presents where one does not want to have the materials).

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

The invention claimed is:

1. A method comprising:
providing a wafer assembly comprising one or more semiconductor dies disposed on a carrier substrate;
depositing at least two metal layers above the one or more semiconductor dies to create at least a portion of a metal substrate, wherein the at least two metal layers comprise:
a stress-reducing layer having a first hardness; and
a harder layer above the stress-reducing layer, wherein the harder layer has a second hardness greater than the first hardness of the stress-reducing layer, wherein the metal substrate comprising the at least two metal layers has a thickness between 10 and 400 μm;
removing the carrier substrate from the wafer assembly; and
manipulating the wafer assembly via the metal substrate for further processing.

2. The method of claim 1, wherein depositing the at least two metal layers comprises at least one of electrochemical deposition (ECD), electroless chemical deposition (ElessCD), chemical vapor deposition (CVD), plasma enhanced chemical vapor deposition (PECVD), physical vapor deposition (PVD), evaporation, or a plasma spray technique.

3. The method of claim 1, further comprising plasma treating the surface of the one or more dies before forming the at least two metal layers above the dies.

4. The method of claim 1, further comprising depositing an oxidation protection layer above the at least two metal layers.

5. The method of claim 4, where the oxidation protection layer comprises at least one of Cr/Au, Ni, or Ni/Au.

6. The method of claim 1, wherein the one or more semiconductor dies are light-emitting diode (LED) dies, power device dies, laser diode dies, or vertical cavity surface emitting device dies.

7. The method of claim 1, wherein removing the carrier substrate comprises at least one of pulse laser irradiation, selected photo-enhanced chemical etching, wet etching, or chemical mechanical polishing.

8. The method of claim 1, wherein the stress-reducing layer comprises copper (Cu).

9. The method of claim 1, wherein the harder layer is thermal expansion compensated.

10. The method of claim 1, wherein the harder layer comprises at least one of molybdenum (Mo), tungsten (W), nickel (Ni), a nickel-cobalt (Ni—Co) alloy, a copper-tungsten (Cu—W) alloy, or a copper-molybdenum (Cu—Mo) alloy.

11. The method of claim 1, further comprising depositing a stress-compensating layer above the harder layer, wherein the stress-compensating layer compensates for stress resulting from the depositing of the harder layer.

12. The method of claim 11, wherein the stress-compensating layer comprises copper (Cu).

13. A method comprising:
   providing a wafer assembly comprising one or more semiconductor dies disposed on a carrier substrate;
   depositing at least two metal layers above the one or more semiconductor dies to create at least a portion of a metal substrate, wherein the at least two metal layers comprise:
      a stress-relieving layer; and
      a thermal-expansion compensating layer deposited above the stress-relieving layer, wherein the metal substrate comprising the at least two metal layers has a thickness between 10 and 400 µm;
   removing the carrier substrate from the wafer assembly; and
   handling the wafer assembly via the metal substrate for further semiconductor processing.

14. The method of claim 13, wherein depositing the at least two metal layers comprises at least one of electrochemical deposition (ECD), electroless chemical deposition (ElessCD), chemical vapor deposition (CVD), plasma enhanced chemical vapor deposition (PECVD), physical vapor deposition (PVD), evaporation, or a plasma spray technique.

15. The method of claim 13, wherein the one or more semiconductor dies comprise light-emitting diode (LED) dies, vertical light-emitting diode (VLED) dies, power device dies, laser diode dies, or vertical cavity surface emitting device dies.

16. The method of claim 13, wherein the stress-relieving layer comprises diamond-mixed copper (Cu).

17. The method of claim 13, wherein the thermal-expansion compensating layer comprises copper (Cu) or a Cu alloy.

18. A method comprising:
   providing a wafer assembly comprising one or more semiconductor dies disposed on a carrier substrate;
   depositing at least two metal layers above the one or more semiconductor dies to create at least a portion of a metal substrate, wherein the at least two metal layers comprise:
      an initial layer comprising a metal or metal alloy matching a thermal expansion coefficient of the semiconductor dies to reduce semiconductor cracking; and
      a thermally conductive layer deposited above the initial layer, wherein the metal substrate comprising the at least two metal layers has a thickness between 10 and 400 µm;
   removing the carrier substrate from the wafer assembly; and
   manipulating the wafer assembly via the metal substrate for further processing.

19. The method of claim 18, wherein the one or more semiconductor dies comprise light-emitting diode (LED) dies, vertical light-emitting diode (VLED) dies, power device dies, laser diode dies, or vertical cavity surface emitting device dies.

20. The method of claim 18, wherein the initial layer comprises at least one of tungsten (W) or molybdenum (Mo).

21. The method of claim 20, wherein the semiconductor dies comprise gallium nitride (GaN).

22. The method of claim 18, wherein the thermally conductive layer comprises at least one of copper (Cu) or silver (Ag).

* * * * *